MULTI-ELECTRODE SEMICONDUCTOR DEVICES

Original Filed March 11, 1953 2 Sheets-Sheet 1

INVENTOR.
JACQUES I. PANKOVE
BY
W. S. Hill
AGENT

INVENTOR.
JACQUES I. PANKOVE
BY
W. S. Hill
AGENT

United States Patent Office 3,108,210
Patented Oct. 22, 1963

3,108,210
MULTI-ELECTRODE SEMICONDUCTOR DEVICES

Jacques I. Pankove, Princeton, N.J., assignor to Radio Corporation of America, a corporation of Delaware
Original application Mar. 11, 1953, Ser. No. 341,689, now Patent No. 3,005,132, dated Oct. 17, 1961. Divided and this application Jan. 16, 1959, Ser. No. 787,154
4 Claims. (Cl. 317—235)

This is a division of U.S. patent application Serial No. 341,689 filed March 11, 1953, now Patent No. 3,005,132 granted October 17, 1961 by Jacques I. Pankove.

This invention relates to semiconductor devices and particularly to multi-electrode, junction-type semiconductor devices.

A typical junction type semiconductor device comprises a body of semiconductor material of one type of conductivity having one or more P-N junctions formed therein. The P-N junctions comprise zones of N-type and P-type conductivity material separated by rectifying barriers which have high resistance to electrical current flow in one direction and low resistance to such flow in the reverse direction.

One type of semiconductor device to which the principles of the invention apply is known as a transistor and may include three separate regions of semiconductor material arranged either in P-N-P or N-P-N order. In such devices, one of the semiconductor regions is operated as an emitter electrode and injects minority charge carriers into a second region, said carriers being collected by the third region which is operated as a collector electrode. A base electrode is generally connected in ohmic contact with the second region and serves to control the emitter-to-collector current flow.

Ordinarily, in transistors, the flow of electrical charge carriers from the emitter to collector proceeds by a process of diffusion as a result of which the charge transit time is comparatively high and the high frequency response is comparatively poor. Furthermore, with current flow by diffusion, all of the charges leaving the emitter do not reach the collector at the same time with the result that phase distortion is present. Furthermore, the typical transistor, although satisfactory for operation as an amplifier, oscillator or the like is not suitable for performing more complex functions such as mixing or switching or for operation in push-pull circuits.

Accordingly, an important object of this invention is to provide a semiconductor device of new and improved form.

A further object is to provide an improved multi-electrode semiconductor device.

Another object is to provide an improved semiconductor device having a plurality of electrodes and capable of performing complex electrical functions.

Still another object is to provide a semiconductor device adapted to perform complex electrical functions and having good high frequency response.

In general, the purposes and objects of this invention are accomplished by the provision of a semiconductor body having a plurality of P-N junction electrodes and a plurality of base electrodes inter-related to accommodate a plurality of signals and to perform comparatively complex electrical functions. In all of devices herein, the semiconductor body has two opposed surfaces, at least one surface of which has a depression therein. At least one of the junction electrodes is located on the body in the depression. Preferably, the body has a depression in each of the opposed surfaces, with one emitter junction electrode located in the depression of one surface, and one or more collector junction electrodes located in the depresssion of the other of said surfaces.

In one aspect of the invention, a device having a double-ended input is provided by a semiconductor body having a single emitter electrode, a single collector electrode and two base electrodes. The device is arranged so that separate signals may be applied thereto between the single emitter and each base electrode. The composite signal is collected by the collector electrode. If desired, more than two base electrodes may be mounted on the base region of the device and a separate signal may be applied to the device between each base electrode and the emitter electrode.

In another aspect of the invention, a semiconductor body is provided a single emitter electrode, two collector electrodes and two base electrodes. One signal is applied to the emitter electrode and a control signal is applied across the device between the two base electrodes. The control signal applies a field to the device between the two base electrodes. The applied field serves to direct and accelerate the flow of charge carriers from the emitter electrode to a particular collector electrode.

The invention is described in greater detail by reference to the accompanying drawings wherein.

Like parts are designated by the same or similar reference numerals throughout the drawings.

Figures 1, 2, 3:
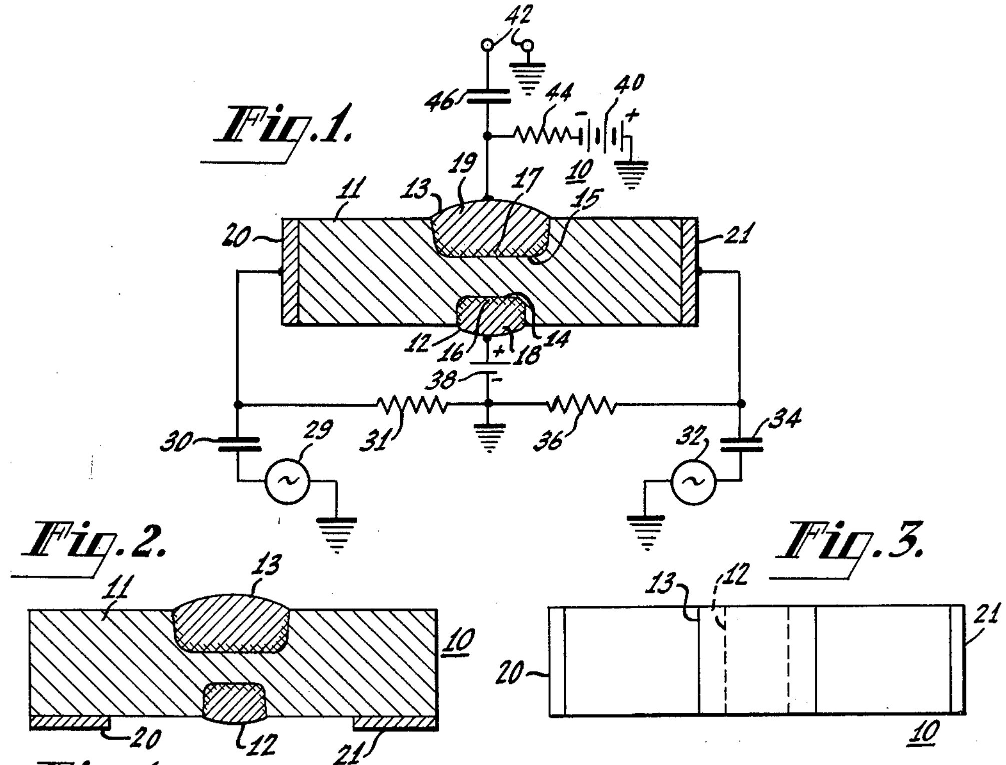
FIG. 1 is a sectional elevational view of a device constructed in accordance with one embodiment of the invention and a schematic representation of a circuit in which the device may be operated.
FIG. 2 is a sectional elevational view of a first modification of the device shown in FIG. 1.
FIG. 3 is a plan view of the device shown in FIG. 1.

Refering to FIGURE 1, there is shown a semiconductor device 10 including a body or crystal of semiconductor material 11 and an emitter electrode 12 and a collector electrode 13. The crystal may be in the form of a disk or it may have a generally rectangular cross-section. In either case, the body 11 preferably has a thickness of the order of 2 mils and is as short as possible to mimimize the base resistance of the device. For the purposes of this application, the device will be described as a P-N-P device although it is to be understood that a device having N-P-N regions may also be utilized to practice the invention.

One satisfactory method for forming the P-N junctions, or emitter and collector electrodes 12 and 13 respectively, is described in a co-pending U.S. application of Charles W. Mueller, Serial No. 295,304, filed June 24, 1952, now abandoned and assigned to the assignee of this application. According to the method described in said application and to form a P-N-P transistor, disks or pellets of indium are placed in contact with opposite surfaces of the body or block 11 of N-type germanium. The assembly of block and pellets is heated in an atmosphere of hydrogen, or an inert gas such as argon, which has first been deoxidized and dried in a liquid air trap. The heating is effected at a temperature sufficient to cause the pellets to melt and alloy with the germanium block to form rectifying barriers 14 and 15, thin P-type regions 16 and 17, and portions 18 and 19 comprising indium-germanium alloy. It is to be understood that the body or block may comprise N-type or P-type germanium, silicon or the like. If the body of the device comprises N-type material, e.g., N-type germanium, then any one of indium, gallium, aluminum, zinc or boron, for example, may be used as the impurity material to produce one or more zones of P-type conductivity and the associated rectifying barriers. If the semiconductor body is of P-type material, then any one of phosphorus, arsenic, antimony or bismuth, for example, may be used to produce one or more zones of N-type conductivity and the associated rectifying barriers.

If desired, the emitter and collector electrodes 12 and 13 may be made of unequal size with one, e.g., 13 intended to be the collector electrode, larger than the other 12 intended to be the emitter electrode. Such an arrangement of unequal size P-N junctions is shown and claimed in a co-pending application of the present inventor, Serial No. 293,330, filed June 13, 1952, now Patent No. 2,974,236, and assigned to the assignee of this application. In addition, the principles of the invention may be applied to semiconductor crystals having the desired P-N junctions formed during the growth of the crystal.

According to the invention, two base electrodes 20 and 21 are bonded to the body at opposite ends thereof and in ohmic contact therewith. The base electrodes may be mounted on the periphery of the body as shown in FIGURE 1 or they may be mounted on one surface of the device as shown in FIGURE 2. The base electrodes may be in the form of disks or plates, or the like, of tin or nickel, or the like soldered to the semiconductor body.

The device described above may take many alternative forms. For example, referring to FIGURE 4, a semiconductor crystal 11′ may be provided with wells or depressions 22 and 23 in opposite surfaces thereof within which the emitter and collector electrodes 12 and 13 may be formed. This construction allows close spacing of emitter and collector electrodes while optimum crystal strength is retained. Electrodes 20 and 21 are provided at the ends of the crystal.

Figures 4, 5, 7:
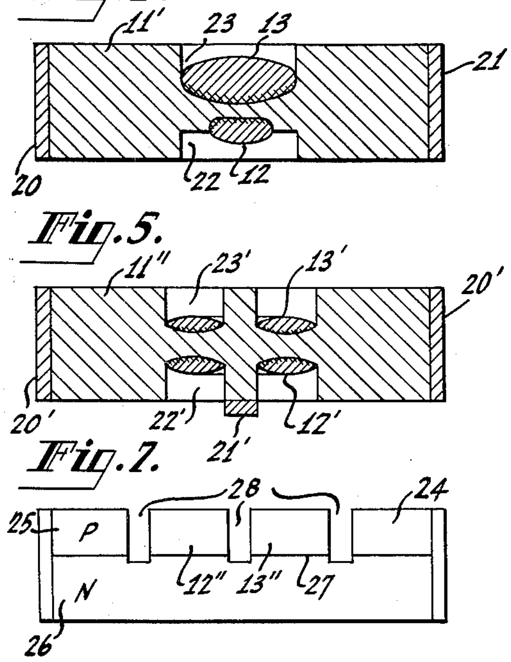
FIG. 4 is a sectional elevational view of a second modification of the device shown in FIG. 1.
FIG. 5 is a sectional elevational view of a third modification of the device shown in FIG. 1.
FIG. 7 is an elevational view of a fourth modification of the device shown in FIG. 1.
Figure 6:
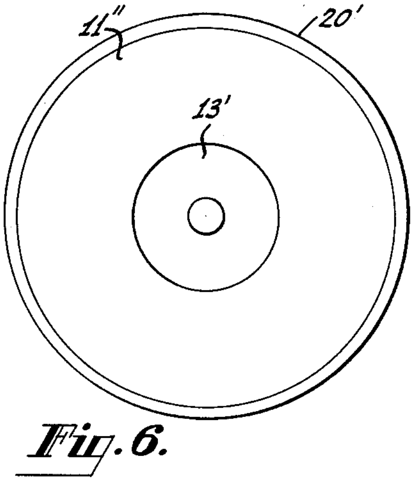
FIG. 6 is a plan view of the device shown in FIG. 5.

Alternatively, referring to FIGURES 5 and 6, a circular crystal 11″ may be provided with annular wells 22′ and 23′ within which annular emitter and collector electrodes 12′ and 13′ respectively may be formed. One base electrode 20′ is in the form of a ring around the periphery of the crystal and another base electrode 21′ is in the form of a plate positioned substantially at the center of one of the electrodes 12′ or 13′.

Another modification of the invention shown in FIGURE 7 comprises a semiconductor crystal 24 having a P-type region 25 and an N-type region 26 separated by a rectifying barrier 27 all of which may be formed during the growing of a crystal. Slots 28 intersecting one of the regions, e.g., 25 and the rectifying barrier 27 form discrete portions of the crystal 12″ and 13″ which may be used as collector and emitter electrodes.

The various slots and wells described above may be formed by any suitable operation including wheel-grinding, etching, electro-arcing, supersonic crushing or the like.

The device described above may be operated in a circuit such as that shown in FIGURE 1. The circuit comprises a dual input arrangement including a first signal source 29 connected between the base electrode 20 and the emitter electrode 12 through a coupling arrangement comprising a capacitor 30 and a resistor 31. Another signal source 32 is connected between the other base electrode 21 and the emitter electrode 12 by means of a similar coupling arrangement comprising a capacitor 34 and a resistor 36. The emitter electrode 12 is biased in the forward direction with respect to the N-type body of the device by connection to the positive terminal of a battery 38, the negative terminal of which is connected to the junction of the resistors 31, 36 and ground. The collector electrode 13 is biased in the reverse direction with respect to the body 11 by a connection to the negative terminal of a battery 40, the positive terminal of which is grounded. The collector electrode is also connected to suitable output terminals 42 through a coupling arrangement comprising a resistor 44 and a capacitor 46. The output signal appearing at the terminals 42 may be fed to any suitable utilization device.

In operation of the device 10, signals from both signal sources 29 and 32 are applied between their respective base electrodes 20 and 21 and the emitter electrode 12 at the same time. Under the control of the two input signals, the current flow from the emitter to the collector electrode 13 is a composite of the two input signals added together.

The device described above may be modified as shown in FIGURE 8 to accommodate three input signals. To this end, there is provided a semiconductor body 54 having a central portion 56 and three radially projecting arms 58, 60, 62. Emitter and collector electrodes 64 and 66 may be positioned concentric with each other on opposite surfaces of the central portion 56 of the body 54. In accordance with the invention, three base electrodes 68, 70, 72 are bonded to the body, one at the end of each of the arms 58, 60 and 62 respectively. In such a construction, each base electrode is sufficiently isolated from the other two so that there is no objectionable interaction between them. With the device shown in FIGURE 8, three signals may be applied to the device and a composite of the three appears in the collector output circuit.

Figures 8, 9, 10, 11, 12, 13, 14, 15:
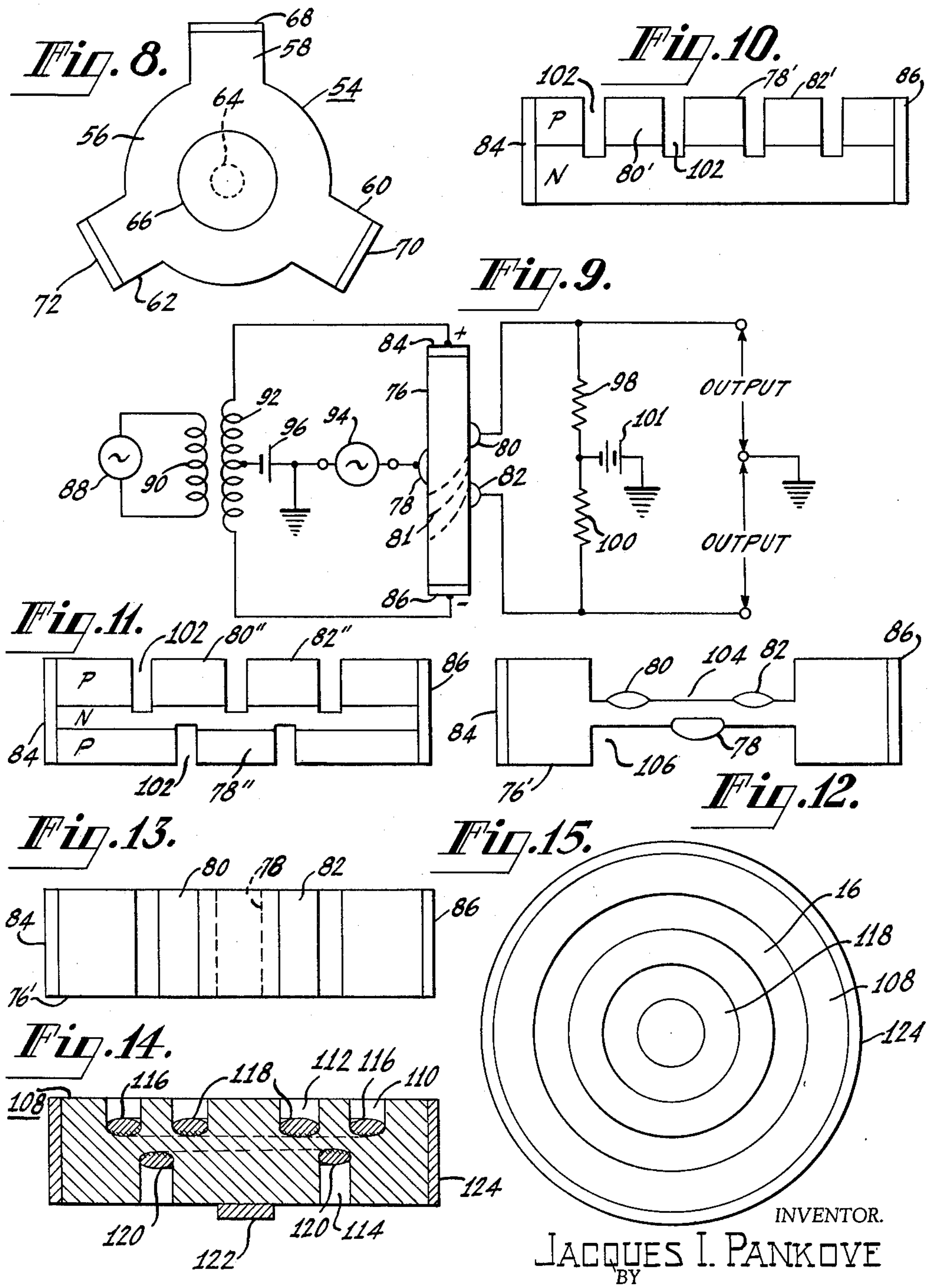
FIG. 8 is a plan view of a device constructed in accordance with a second modification of the invention.
FIG. 9 is an elevational view of a device constructed in accordance with a third modification of the invention and a schematic circuit in which the device may be operated.
FIG. 10 is an elevational view of a first alternative construction of the device shown in FIG. 9.
FIG. 11 is an elevational view of a second alternative construction of the device shown in FIG. 9.
FIG. 12 is an elevational view of a third alternative construction of the device shown in FIG. 9.
FIG. 13 is a plan view of the device shown in FIG. 12.
FIG. 14 is a sectional elevational view of a fourth modification of the device shown in FIG. 9; and, FIG. 15 is a plan view of the device shown in FIG. 14.

Another embodiment of the invention is shown in FIGURE 9 and comprises a semiconductor body 76 having a generally rectangular cross section and having a single emitter P-N junction electrode 78 formed on one surface thereof and two collector P-N junction electrodes 80, 82 formed on the opposite surface. The collector junctions are arranged generally symmetrically with respect to the emitter junction and all of the junctions comprise the same component parts as those described above. In this embodiment, too, base electrodes 84, 86 are mounted in ohmic contact at each end of the semiconductor body.

The device shown in FIGURE 9 may be operated in a circuit which includes a first signal source 88 connected between the two base electrodes and across the length of the body 76 through a transformer having a primary winding 90 and a secondary winding 92. The two ends of the secondary winding 92 are connected to the base electrodes 84 and 86 so that when one electrode is positive, the other is negative. Another signal source 94 is connected in series with the emitter electrode 78 which is biased in the forward direction with respect to the body 76 by a connection to the positive terminal of a battery, the negative terminal of which is connected to the midpoint of the transformer secondary winding 92.

The collector electrodes 80, 82 are connected to provide a double-ended output arrangement. In such an output arrangement, each collector electrode is connected to a pair of output terminals having a common ground connection. Load resistors 98, 100 are connected between the collector electrodes and the negative terminal of a battery 101, the positive terminal of which is grounded. The collector electrodes 80, 82 are thus biased in the reverse direction with respect to the body 76 of the device.

In operation of the device shown in FIGURE 9, the signal applied to the emitter electrode 78 from the source 94 induces the emitter to inject minority charge carriers into the semiconductor body 76. At the same time, the signal applied between the base electrodes 84, 86 from the source 88 induces in the body 76 an electric field which determines to which collector electrode the injected charges flow. For example, if the signal applied between the base electrodes is a simple alternating signal, the device is operating in a manner akin to push-pull operation. During one portion of the signal cycle, for example, when the electrode 86 is negative, the field through the body 76 between the base electrodes is in part as shown by the equipotential lines 81. Such a field induces current flow principally to the collector electrode 82. During the reverse portion of the cycle the field is reversed and current flows to the other collector electrode 80. If a pulsating signal were applied from the source 88, then the device would perform essentially a switching operation but in the same general manner.

In this embodiment of the invention, as in that described above, a semiconductor crystal having grown P-N junctions may be employed. Such a crystal may take either of the forms shown generally in FIGURES 10 and 11. To form the desired emitter and collector electrodes suitable slots 102 are cut in the crystal by any suitable operation such as a grinding with a grinding wheel, etching, electro-arcing, supersonic crushing, or the like. The base electrodes 84 and 86 are mounted, as described above, at the ends of the crystal. The base electrodes may overlie and contact the different conductivity type regions comprising the crystal without impairing the operation of the device since the emitter electrode 78' or 78'' and collector electrodes 80' or 80'' and 82' or 82'' are satisfactorily isolated from the base electrodes outside the region where interaction is desired. One particular advantage of the device shown in FIGURE 11 is that the intermediate N-type region between the emitter electrode 78'' and the collector electrodes 80'' and 82'' is quite thin and the field thereacross is strong enough to provide relatively easy passage of minority charge carriers.

According to a further modification of the invention illustrated in FIGURES 12 and 13, the device described above with reference to FIGURE 9 may be fabricated from a germanium crystal 76' having depressions or wells 104, 106 formed in opposite surfaces and extending across the width of the body as shown in FIGURE 13. The wells are provided for receiving the pellets of impurity material from which the various P-N junctions are formed by an alloying operation which produces closely spaced junctions. The wells or grooves 104, 106 are formed by any of the methods mentioned above for forming the slots 102 and are of such a depth that the remaining portion of the crystal separating the grooves has a thickness of the order of one mil. The emitter electrode 78 and the collector electrodes 80 and 82 are formed in the depressions or grooves 106, 104 respectively. This modification provides closely spaced P-N junctions without sacrificing crystal strength. This general form of semiconductor device is shown, and claimed in a co-pending application of the present inventor, Serial No. 319,193, filed November 7, 1952 and assigned to the assignee of this invention.

According to a further modification of the invention, the device shown in FIGURE 9 may be provided with annular electrodes. Such a configuration is shown in FIGURES 14 and 15 and includes a semiconductor body 108 which is provided with annular grooves 110, 112, 114. The grooves are positioned concentric with each other on opposite surfaces of the body and are adapted to receive two collector electrodes 116 and 118 on one side and one emitter electrode 120 on the other side of the body 108 respectively. Base electrodes 122, 124 are soldered to the body 108, one, e.g., 122 centered with respect to the electrode 120 and the other in annular form and around the periphery of the body.

What is claimed is:

1. A semiconductor device comprising a body of semiconductor material having two opposed surfaces, a depressed area of annular configuration in one of said surfaces, a rectifying barrier electrode in said area, an ohmic electrode making contact with said body in the surface area enclosed by said annular depressed area, and another ohmic electrode bonded in annular configuration to said body outside said annular depressed area.

2. A semiconductor device comprising a body of semiconductor material having two opposed surfaces, an annular-shaped depressed area in one of said opposed surfaces, a rectifying barrier electrode in said area, an ohmic electrode making contact with said body in the surface enclosed by said annular depressed area, another ohmic electrode bonded in annular configuration to said body outside said annular depressed area, and at least one other rectifying barrier electrode on the other of said opposed surfaces of said body.

3. A semiconductor device comprising a body of semiconductor material having two opposed major surfaces, a depression in each of said surfaces, an annular first rectifying junction electrode on said body in the depression of one of said surfaces, an annular second rectifying junction electrode on said body in the depression of the other of said surfaces, said rectifying electrodes being aligned along a common axis, and a pair of non-rectifying electrodes positioned on said body, the first of said non-rectifying electrodes positioned within the area enclosed by said annular first rectifying electrode, and the second of said non-rectifying electrodes being annular and positioned around one of said rectifying electrodes.

4. A semiconductor device comprising a circular body of semiconductor material having two opposed major surfaces, a depression in each of said surfaces, an annular first rectifying junction electrode on said body in the depression of one of said surfaces, an annular second rectifying junction electrode on said body in the depression of the other of said opposed surfaces, said rectifying electrodes being aligned along a common axis, and a pair of non-rectifying electrodes positioned on said body, the first of said non-rectifying electrodes positioned within the area enclosed by one of said annular rectifying electrodes, and the second of said non-rectifying electrodes being annular and positioned around the periphery of said body.

References Cited in the file of this patent

UNITED STATES PATENTS

| | | |
|---|---|---|
| 2,600,500 | Haynes et al. | June 17, 1952 |
| 2,666,814 | Shockley | Jan. 19, 1954 |
| 2,764,642 | Shockley | Sept. 25, 1956 |
| 2,975,342 | Rediker | Mar. 14, 1961 |